(12) United States Patent
Ando (10) Patent No.: US 7,871,883 B2
(45) Date of Patent: Jan. 18, 2011

(54) METHOD OF MANUFACTURING SEMICONDUCTOR DEVICE INCLUDES THE STEP OF DEPOSITING THE CAPACITOR INSULATING FILM IN A FORM OF A HAFNIUM SILICATE

(75) Inventor: Takashi Ando, Tokyo (JP)

(73) Assignee: Sony Corporation, Tokyo (JP)

( * ) Notice: Subject to any disclaimer, the term of this patent is extended or adjusted under 35 U.S.C. 154(b) by 129 days.

(21) Appl. No.: 11/519,704

(22) Filed: Sep. 11, 2006

(65) Prior Publication Data

US 2007/0066010 A1    Mar. 22, 2007

(30) Foreign Application Priority Data

Sep. 21, 2005    (JP)    ............... 2005-273145

(51) Int. Cl.
*H01L 21/8242*    (2006.01)
(52) U.S. Cl. .............. 438/243; 438/785; 257/301; 257/E21.396; 257/E21.651
(58) Field of Classification Search ......... 438/243, 438/239, 240, 785; 257/301, E21.01, E21.396, 257/E21.651
See application file for complete search history.

(56) References Cited

U.S. PATENT DOCUMENTS 6,190,988 B1 *    2/2001    Furukawa et al. ........... 438/386
6,528,384 B2 *    3/2003    Beckmann et al. .......... 438/386
6,844,604 B2 *    1/2005    Lee et al. .................... 257/410
2004/0012043 A1 *    1/2004    Gealy et al. ................. 257/303
2005/0233598 A1 *    10/2005    Jung et al. ................... 438/785

FOREIGN PATENT DOCUMENTS

| JP | 2004-104025 | 4/2004 |
| JP | 2004-165668 | 6/2004 |
| JP | 2005-209774 | 8/2005 |
| WO | WO 2004/094695 | 11/2004 |
| WO | WO 2004/105083 | 12/2004 |

* cited by examiner

*Primary Examiner*—Khiem D Nguyen
(74) *Attorney, Agent, or Firm*—Robert J. Depke; Rockey, Depke & Lyons, LLC

(57) ABSTRACT

The invention aims at enabling leakage current characteristics and a step coverage property to be improved by depositing a hafnium silicate film by utilizing an atomic layer evaporation method using a hafnium raw material, a silicon raw material and an oxidizing agent. Disclosed herein is a method of manufacturing a semiconductor device having a trench capacitor including a first electrode formed on an inner surface of a trench, a capacitor insulating film formed on a surface of the first electrode, and a second electrode formed on a surface of the capacitor insulating film. The method includes the step of depositing the capacitor insulating film in a form of a hafnium silicate film by utilizing an atomic layer deposition method using a hafnium raw material, a silicon raw material and an oxidizing agent.

6 Claims, 5 Drawing Sheets

METHOD OF MANUFACTURING SEMICONDUCTOR DEVICE INCLUDES THE STEP OF DEPOSITING THE CAPACITOR INSULATING FILM IN A FORM OF A HAFNIUM SILICATE

CROSS REFERENCE TO RELATED APPLICATION

The present invention contains subject matter related to Japanese Patent Application JP 2005-273145 filed in the Japanese Patent Office on Sep. 21, 2005, the entire contents of which being incorporated herein by reference.

BACKGROUND OF THE INVENTION

1. Field of the Invention

The present invention relates to a method of manufacturing a semiconductor device with which a capacitor insulating film of a trench capacitor having a deep trench can be readily formed of a hafnium silicate film having a low impurity concentration and having an excellent step coverage property.

2. Description of Related Art

Along with scale down of semiconductor devices, the examination about application of a high dielectric constant film (a High-k film) to a material for each of a gate insulating film and a capacitor insulating film has been carried out. A lot of High-k films are made in the form of metallic oxides or silicate materials thereof. Of them, HfSiON which has a heat-resistance property as well as a High-k is a promising candidate for the material for each of the gate insulating film and the capacitor insulating film. High level control for a film thickness and a composition can be made by utilizing an atomic layer deposition (ALD) method of the various film depositing methods. This ALD method, for example, is described in Japanese Patent Laid-open No. 2004-165668. In any of the High-k materials, it has been found out that a leakage current is caused to flow through a film via trap levels provided by impurities contained in the film. Thus, it is very important to reduce a concentration of the impurities (such as carbon (C), hydrogen (H) and chlorine (Cl)) from a raw material. In spite of this situation, it is difficult to sufficiently remove the impurities through a treatment for changing a film property after deposition of the film. Therefore, it is important to sufficiently reduce the concentration of the impurities contained in the film at a stage of the film deposition.

On the other hand, for the purpose of promoting scale down, each of the recent capacitors ensures a sufficient surface area by adopting a three-dimensional structure such as a cylindrical shape or a deep trench (DT) shape. Thus, each of the recent capacitors maintains the data holding property. Therefore, it is necessary to realize a technique for forming an insulating film with excellent step coverage for the three-dimensional structure.

With the ALD method, since a gas phase reaction is suppressed as a temperature is lower, the excellent coverage property can be obtained. However, since the step coverage and the concentration of the impurities contained in the film show a trade-off relationship, it is difficult to find out the process condition under which the excellent step coverage property and reduction of the impurity concentration are met.

SUMMARY OF THE INVENTION

A problem to be solved is that since the ALD method is utilized in the low temperature process, it is difficult to obtain a fine film containing therein less impurities.

Although since with the ALD method, the gas phase reaction is generally suppressed as the temperature is lower, the excellent coverage property can be obtained, the step coverage and the concentration of the impurities contained in the film show the trade-off relationship.

In the light of the foregoing, it is desirably to provide a method of manufacturing a semiconductor device with which an insulating film for a High-k capacitor can be deposited by utilizing an ALD method.

According to an embodiment of the present invention, there is provided a method of manufacturing a semiconductor device having a trench capacitor including: a first electrode formed on an inner surface of a trench; a capacitor insulating film formed on a surface of the first electrode; and a second electrode formed on a surface of the capacitor insulating film; the method including the step of: depositing the capacitor insulating film in a form of a hafnium silicate film by utilizing an atomic layer deposition method using a hafnium raw material, a silicon raw material and an oxidizing agent.

In an embodiment of the method of manufacturing a semiconductor device according to the present invention, the capacitor insulating film of the trench capacitor is deposited in the form of the hafnium silicate film by utilizing the atomic layer deposition method using the hafnium raw material, the silicon raw material and the oxidizing agent. Thus, it becomes possible to reduce a concentration of impurities such as carbon (C) contained in the hafnium silicate film. In addition, the hafnium silicate film can be deposited so as to obtain the excellent step coverage when the trench capacitor is formed by adjusting a substrate temperature and a film deposition pressure for the hafnium silicate film. In such a manner, reduction in concentration of the impurities such as carbon (C) enables a generation level of the leakage current to become equal to or lower than an allowable level for the capacitor insulating film.

For example, when tetrakis methylethyl amino hafnium: $Hf[N(CH_3)(C_2H_5)]_4$ is used as the hafnium raw material, and tetrakis methylethyl amino silicon: $Si[N(CH_3)(C_2H_5)]_4$ is used as the silicon raw material in order to deposit a hafnium silicate ($HfSiO_x$) film, it may be impossible to avoid a situation in which a part of carbon contained in the raw material for the hafnium silicate film to be deposited is retained in the resulting hafnium silicate film. Thus, the residual carbon (C) generates the trap levels contributing to the leakage current. In the embodiment of the present invention, the concentration of the impurities contained in the hafnium silicate film can be sufficiently reduced by utilizing the atomic layer deposition method using those raw materials and ozone ($O_3$) as the oxidizing agent. As a result, the leakage current can be made to fall within the allowable range for the capacitor insulating film.

In addition, when the hafnium silicate film is deposited in order to form the three-dimensional capacitor having a large surface area by utilizing the atomic layer deposition method, it is necessary that a sufficient amount of precursor is supplied, and also its thermal decomposition in the gas phase and its reaction with the residual gas are suppressed, thereby accelerating the adsorption reaction of the precursor on the surface. In the embodiment of the present invention, when $Hf[N(CH_3)(C_2H_5)]_4$ is used as the hafnium raw material, and $Si[N(CH_3)(C_2H_5)]_4$ is used as the silicon raw material in order to deposit the $HfSiO_x$ film, even in the case of, for example, the trench shape having a large surface area, the sufficient coverage property can be obtained by specifying the range of the pressure of the film deposition ambient atmosphere, and the range of the substrate temperature thereof.

In the embodiment of the method of manufacturing a semiconductor device according to the present invention, the capacitor insulating film of the trench capacitor is deposited in the form of the hafnium silicate film by utilizing the atomic layer deposition method using the hafnium raw material, the silicon raw material and the oxidizing agent. Hence, the concentration of the impurities such as carbon (C) contained in the hafnium silicate film can be reduced, and also the film deposition having the excellent step coverage can be carried out by adjusting the substrate temperature and the film deposition pressure. As a result, the embodiment of the method of manufacturing a semiconductor device according to the present invention has an advantage that the level of the leakage current of the trench capacitor can be reduced to the allowable level.

DETAILED DESCRIPTION OF THE PREFERRED EMBODIMENTS

An embodiment according to a method of manufacturing a semiconductor device of the present invention will be described hereinafter in detail with reference to manufacturing process cross sectional views shown in FIGS. 1A to 1D, respectively. At that, since FIGS. 1A to 1D are schematically drawn, an aspect contraction scale ratio is not made to agree with an actual one.

Figure 1A:
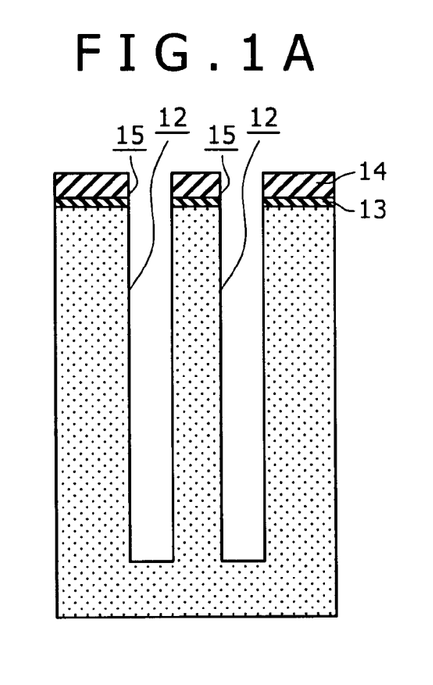
FIGS. 1A to 1D are respectively manufacturing process cross sectional views showing an embodiment of a method of manufacturing a semiconductor device according to the present invention.

As shown in FIG. 1A, trenches 12 in which a capacitor is intended to be formed are formed in a semiconductor substrate (or a semiconductor layer) 11. By the way, with regard to a method of forming the trench 12, there are the various kinds of existing methods. An example of the method of forming the trench 12 is as follows. That is to say, an oxide film 13 and a nitride film 14 are formed in this order on a surface of the semiconductor substrate (or the semiconductor layer) 11. After that, after a mask layer (not shown) which is used to form each trench is formed by utilizing a normal photolithography technique, opening portions 15 are formed in the nitride film 14 and the oxide film 13 with the mask layer as an etching mask by using any suitable etching method. Moreover, the semiconductor substrate 11 is selectively etched away to form the trenches 12 with both the mask layer and the nitride film 14 as an etching mask. A reactive ion etching is performed for the etching process described above. Each trench 12 at this time, for example, has a depth in the range of 5.0 to 8.0 µm, and an opening thereof on the surface of the semiconductor substrate 11 has the range of several tens of nanometers to 250 nm. Consequently, the trenches 12 each having an aspect ratio of 400 or more are formed.

After that, the mask layer is removed through, for example, a chemical treatment. As a result, the surface of the nitride film 14 is exposed.

Figure 1B:
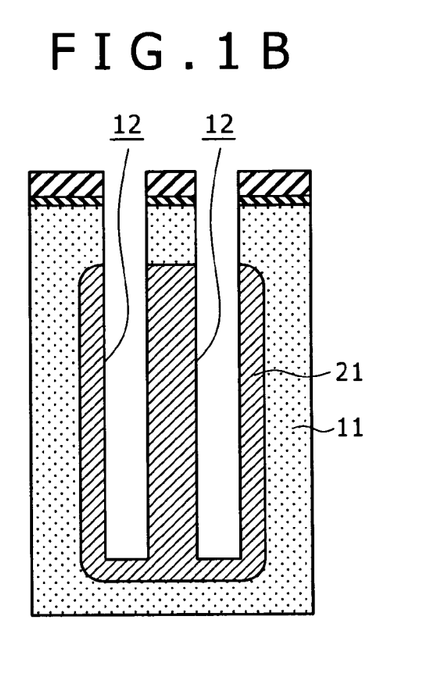

Next, as shown in FIG. 1B, a space within each trench 12 is cleaned for the purpose of forming a plate side electrode. After that, a portion of the semiconductor substrate 11 of the inside of each trench 12 is doped with arsenic (As) or phosphorus (P) through, for example, the vapor phase diffusion to form a first electrode (plate electrode) 21.

Figure 1C:
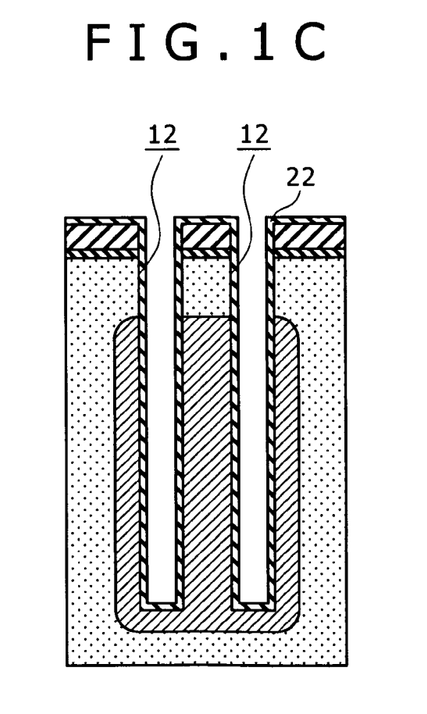

Next, as shown in FIG. 1C, a capacitor insulating film 22 is formed on an inner surface of each trench 12.

Figure 1D:
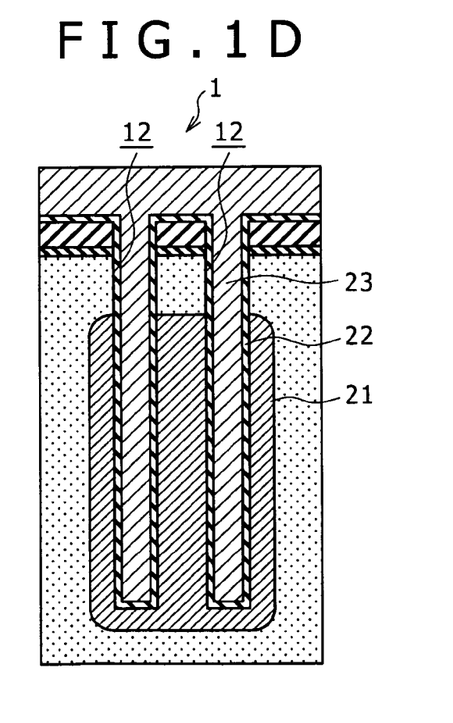

Next, as shown in FIG. 1D, a second electrode (node electrode) 23 is formed inside each trench 12 through the capacitor insulating film 22. The second electrode 23, for example, can be made of amorphous silicon or polysilicon containing therein impurities of a certain conductivity type. Otherwise, the second electrode 23 may also be made of metal. A capacitor 1 including the first electrode 21, the capacitor insulating film 22 and the second electrode 23 is formed in the manner as described above.

Next, a method of forming the capacitor insulating film 22 will be described hereinafter in detail. The capacitor insulating film 22 is formed in the form of a hafnium silicate (HfSiO$_x$) film. An atomic layer deposition (ALD) method (hereinafter referred to as "an ALD method" for short) is utilized in a process for forming the hafnium silicate film. With regard to the ALD method, there are known a method of simultaneously introducing a hafnium raw material and a silicon raw material into a film deposition ambient atmosphere to deposit the hafnium silicate film with one cycle, and another method of alternately depositing a hafnium oxide (HfO$_2$) thin film and a silicon oxide (SiO$_2$) thin film to form the hafnium silicate film. In this embodiment of the present invention, the former film depositing method is adopted.

Any of hafnium tetrachloride: HfCl$_4$, tetrakis acetylacetone athafnium: Hf(C$_5$H$_7$O$_2$)$_4$, tetrakis diethyl amino hafnium: Hf[N(C$_2$H$_5$)$_2$]$_4$, tetrakis dimethyl amino hafnium: Hf[N(CH$_3$)$_2$]$_4$, tetra-t-butoxy hafnium: Hf[O(t-C$_4$H$_9$)]$_4$, and tetrakis methylethyl amino hafnium: Hf[N(CH$_3$)(C$_2$H$_5$)]$_4$ can be used as the hafnium (Hf) raw material. In this embodiment, tetrakis methylethyl amino hafnium: Hf[N(CH$_3$)(C$_2$H$_5$)]$_4$ is used as an example.

In addition, any of silicon tetrachloride: SiCl$_4$, disilicon hexachloride: Si$_2$Cl$_6$, tetrakis dimethyl amino silicon: Si[N(CH$_3$)$_2$]$_4$, dimethyl disiloxane: [(CH$_3$)$_2$SiH]$_2$O, tridimethyl amino silane: SiH[N(CH$_3$)$_2$]$_3$, and tetrakis methylethyl amino silicon: Si[N(CH$_3$)(C$_2$H$_5$)]$_4$ can be used as the silicon (Si) raw material. In this embodiment, tetrakis methylethyl amino silicon: Si[N(CH$_3$)(C$_2$H$_5$)]$_4$ is used as an example.

In addition, any of ozone: $O_3$, oxygen: $O_2$, water (water vapor): $H_2O$, heavy water: $D_2O$, and the like can be used as the oxidizing agent. In this embodiment, ozone: $O_3$ is used as an example.

Also, argon (Ar) can be used as a purge gas. At that, although in addition to argon, a rare gas, a nitrogen gas or the like can be used as the purge gas, taking a purge efficiency, a cost and the like into consideration, argon is preferably used.

A basic cycle of supply of the gas to the film deposition ambient atmosphere (for example, within a chamber) when a hafnium silicate film is deposited by utilizing the ALD method using the hafnium raw material, the silicon raw material and the oxidizing agent is as follows. That is to say, introduction of the hafnium raw material and the silicon material, suppression of the gas phase reaction of the residual gases (the hafnium raw gas and the silicon raw material gas) by introduction of the purge gas, introduction of the oxidizing gas, and suppression of the gas phase reaction of the residual gas (oxidizing gas) by introduction of the purge gas are carried out in this order. In the oxidation process in this embodiment, ozone ($O_3$) having a concentration of about 250 g/m$^3$ is caused to flow into the film deposition ambient atmosphere at a flow rate of about 350 cm$^3$/min with oxygen ($O_2$) as a carrier gas.

An oxidizing force by ozone ($O_3$) can be adjusted by adjusting a pressure of the substrate temperature and the film deposition ambient atmosphere (for example, within the chamber) during the process in which the ALD method is utilized. For example, the oxidizing force by ozone ($O_3$) is increased by adopting the process of the high temperature and high pressure, which makes it possible to reduce the concentration of the impurities contained in the hafnium silicate (HfSiO$_x$) film.

Figure 2:
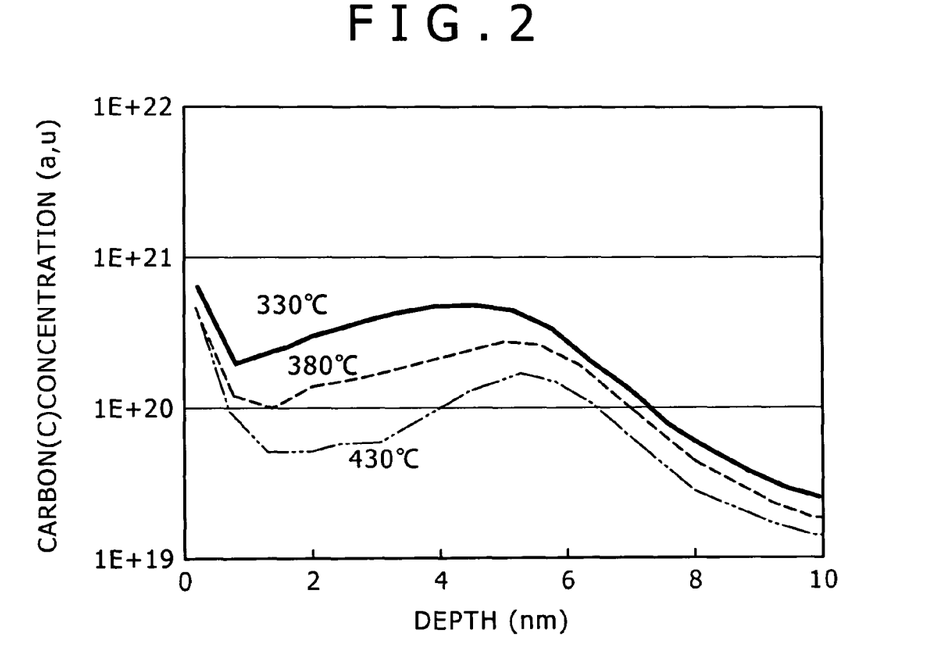
FIG. 2 is a graphical representation showing a relationship between a carbon (C) concentration in a hafnium silicate (HfSiO$_x$) film and a depth position, when the HfSiO$_x$ film is deposited, with a substrate temperature as a parameter.

A change in concentration of carbon (C) contained in the hafnium silicate film when the hafnium silicate film is deposited by changing the substrate temperature will now be described as an example with reference to FIG. 2. FIG. 2 is a graphical representation showing a relationship between the carbon (C) concentration in the hafnium silicate (HfSiO$_x$) film and a depth position, when the HfSiO$_x$ film is deposited, with the substrate temperature as a parameter. In the figure, an axis of ordinate represents a concentration of the residual carbon (C) contained in the hafnium silicate film, and an axis of abscissa represents a depth of the hafnium silicate film.

As shown in FIG. 2, it is understood that the concentration of the residual carbon (C) contained in the hafnium silicate film is reduced by increasing the substrate temperature.

Figure 3:
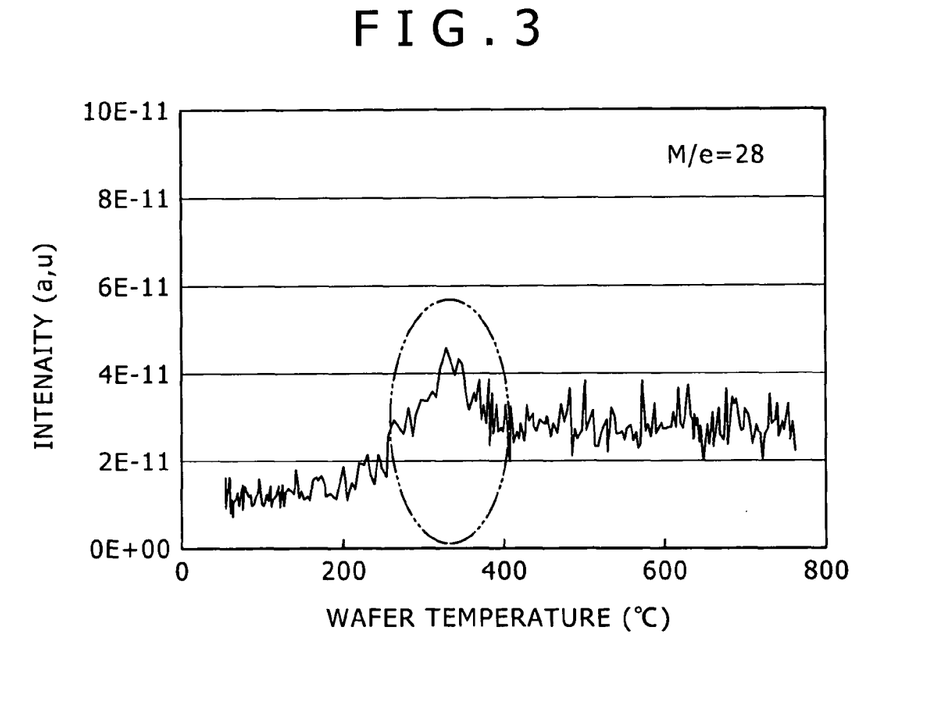
FIG. 3 is a spectrum diagram showing a molecular weight (corresponding to M/e=28:C$_2$H$_4$) in the HfSiO$_x$ film which is obtained by utilizing a thermal deposition spectroscopy (TDS)

In addition, FIG. 3 is a spectrum diagram showing a molecular weight (corresponding to M/e=28:$C_2H_4$) in the hafnium silicate (HfSiO$_x$) film which is obtained by utilizing a thermal desorption spectroscopy (TDS). In the figure, an axis of ordinate represents a detection intensity, and an axis of abscissa represents a substrate temperature.

As shown in FIG. 3, the desorption of an organic substrate corresponding to $C_2H_4$ was confirmed at a temperature near 330° C. Consequently, it is understood that for the purpose of sufficiently reducing the concentration of the residual carbon contained in the hafnium silicate film, the substrate temperature during the ALD process is desirably set at a high temperature of 330° C. or more.

Next, a relationship between a leakage current and an equivalent oxide thickness when a pressure of the film deposition ambient atmosphere is made constant will now be explained with reference to FIG. 4. In the figure, an axis of ordinate represents the leakage current, and an axis of abscissa represents the equivalent oxide thickness.

Figure 4:
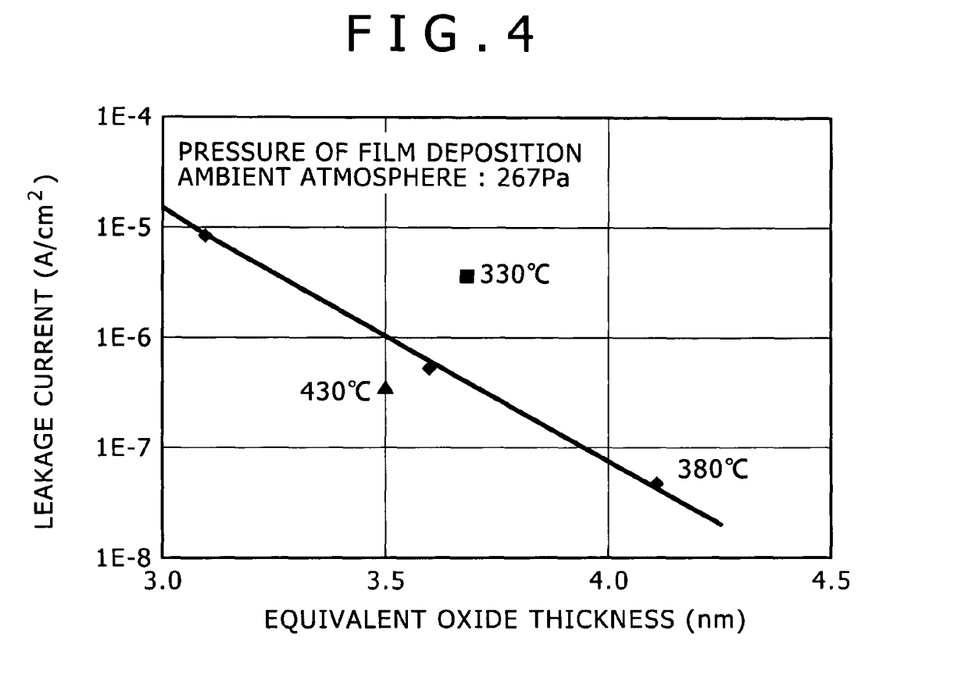
FIG. 4 is a graphical representation showing a relationship between a leakage current and an equivalent oxide thickness when a pressure of a film deposition ambient atmosphere is made constant.

As shown in FIG. 4, it is understood that when the pressure of the film deposition ambient atmosphere is made constant (for example, at 267 Pa), in the same equivalent oxide film, the leakage current shows a tendency to increase as the substrate temperature is lower.

In addition, a relationship between a leakage current and an equivalent oxide thickness when the substrate temperature is made constant (for example, at 380° C.) will now be described with reference to FIG. 5. In the figure, an axis of ordinate represents the leakage current, and an axis of abscissa represents the equivalent oxide thickness.

Figure 5:
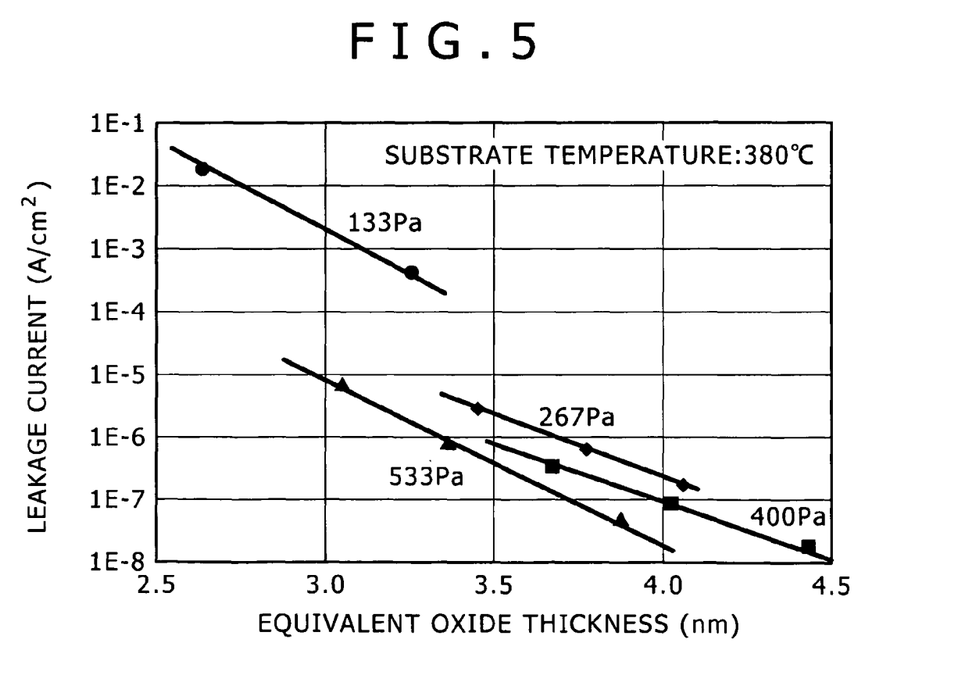
FIG. 5 is a graphical representation showing a relationship between a leakage current and an equivalent oxide thickness when a substrate temperature is made constant (for example, at 380° C.)

As shown in FIG. 5, it is understood that when the substrate temperature is made constant (for example, at 380° C.), in the same equivalent oxide thickness, the leakage current shows a tendency to increase as the pressure of the film deposition ambient atmosphere is lower. In addition, as can be seen from FIG. 5, it is understood that when the pressure of the film deposition ambient atmosphere becomes equal to or lower than 267 Pa, the leakage current abruptly increases. Consequently, the pressure of the film deposition ambient atmosphere is preferably equal to or higher than 267 Pa.

Next, a relationship among a leakage current, a step coverage and a pressure of the film deposition ambient atmosphere when a composition ratio of hafnium to silicon is made constant (for example, Hf/(Hf+Si)=50%) will now be described with reference to FIG. 6. In the figure, a left axis of ordinate represents the leakage current, a right axis of ordinate represents a step coverage, and an axis of abscissa represents the pressure of the film deposition ambient atmosphere.

Figure 6:
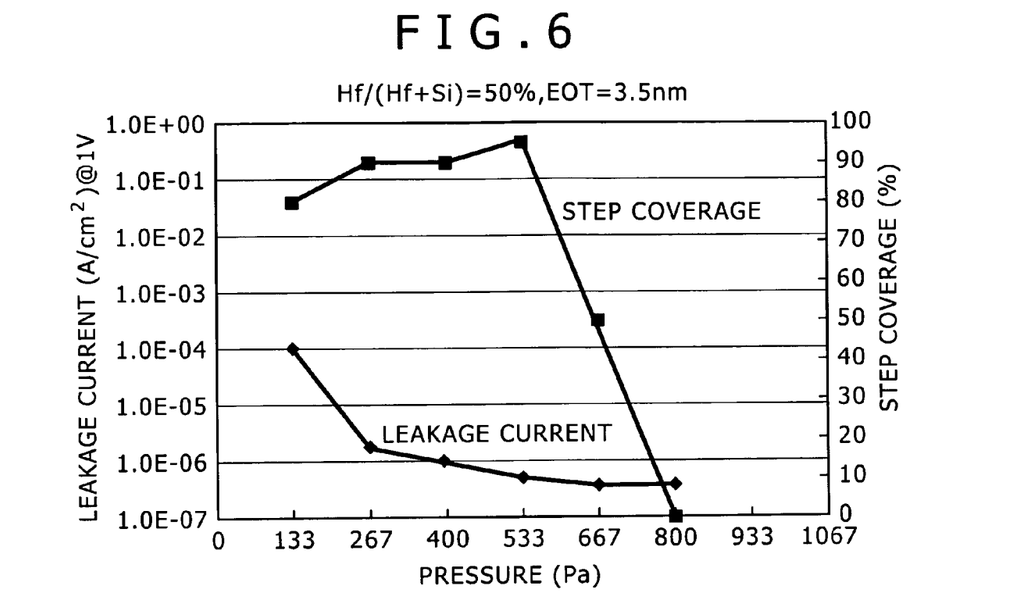
FIG. 6 is a graphical representation showing a relationship among a leakage current, a step coverage and a pressure of a film deposition ambient atmosphere when a composition ratio of hafnium to silicon is made constant (for example, Hf/(Hf+Si)=50%)

As shown in FIG. 6, it is understood that although when the pressure of the film deposition ambient atmosphere is equal to or higher than 267 Pa, the leakage current is suppressed to a low level, the pressure of the film deposition ambient atmosphere becomes lower than 267 Pa, the leakage current increases. This increase in leakage current results from that when the pressure of the film deposition ambient atmosphere is lower than 267 Pa, the concentration of the esidual impurities contained in the hafnium silicate film becomes easy to increase. In addition, it is also understood that the step coverage becomes abruptly worse when the pressure of the film deposition ambient atmosphere becomes higher than 533 Pa, the step coverage becomes 50% when the pressure of the film deposition ambient atmosphere becomes 667 Pa, and no step coverage is obtained at all when the pressure of the film deposition ambient atmosphere becomes 800 Pa. That is to say, when the pressure of the film deposition ambient atmosphere becomes 800 Pa, the hafnium silicate film cannot be deposited on a bottom of the trench. This situation results from that when the pressure of the film deposition ambient atmosphere becomes higher than 667 Pa, the film deposition is carried out based on the CVD reaction. When the above is summarized, in order to obtain the excellent electrical characteristics and step coverage, the pressure of the film deposition ambient atmosphere is preferably equal to or higher than 267 Pa and equal to or lower than 667 Pa. Also, the pressure of the film deposition ambient atmosphere is more preferably equal to or higher than 267 Pa and equal to or lower than 533 Pa. It should be noted that the step coverage characteristics shown in FIG. 6 are those for the so-called deep trench having the aspect ratio of about 50.

Figure 7:
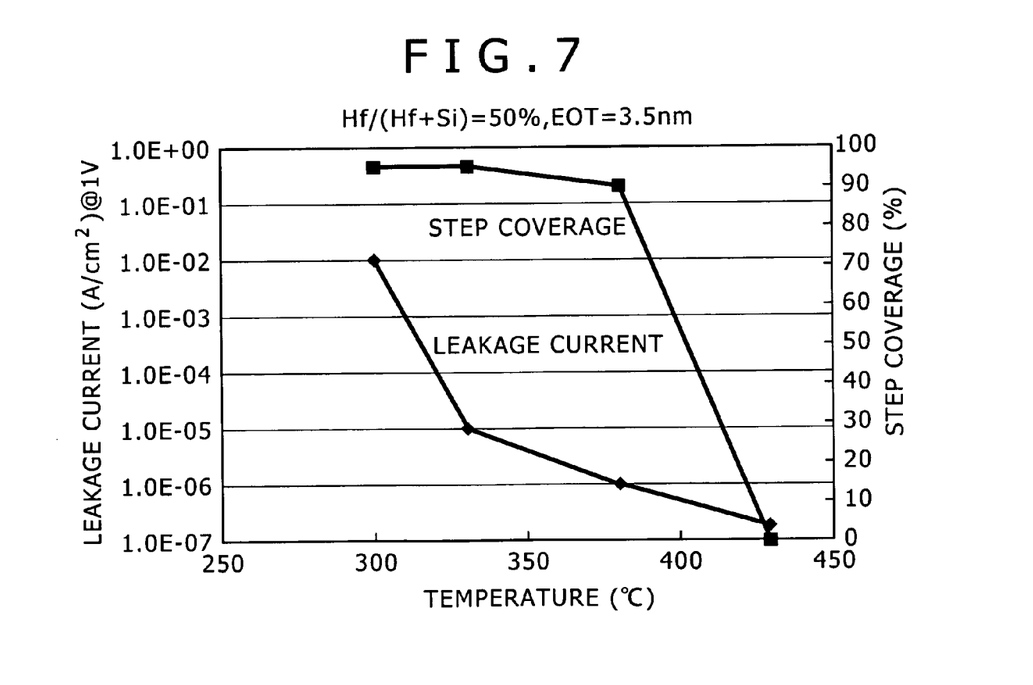
FIG. 7 is a graphical representation showing a relationship among a leakage current, a step coverage and a substrate temperature when a composition ratio of hafnium to silicon is made constant (for example, Hf/(Hf+Si)=50%)

Moreover, FIG. 7 is a graphical representation showing a relationship among a leakage current, a step coverage and a substrate temperature when the composition ratio of hafnium to silicon is made constant (for example, Hf/(Hf+Si)=50%). In the figure, a left axis of ordinate represents the leakage current, a right axis of ordinate represents a step coverage, and an axis of abscissa represents the substrate temperature.

As shown in FIG. 7, it is understood that although the leakage current is suppressed to a low level when the substrate temperature is equal to or higher than 330° C., the leakage current increases when the substrate temperature is lower than 330° C. This situation results from that the concentration of the residual impurities contained in the hafnium silicate film, especially, carbon (C) becomes easy to increase. In addition, it is also understood that when the substrate temperature is higher than 400° C., the step coverage abruptly becomes worse. This situation results from that when the substrate temperature is higher than 400° C., the precursor is thermally decomposed, and thus the film deposition process is not made based on the atomic layer deposition, but is made based on the CVD. When the above is summarized, in order to obtain the excellent electrical characteristics and step coverage, the substrate temperature is preferably equal to or higher than 330° C. and equal to or lower than 400° C. It should be noted that the step coverage characteristics shown in FIG. 7 are those for the so-called deep trench having the aspect ratio of about 50.

Figure 8:
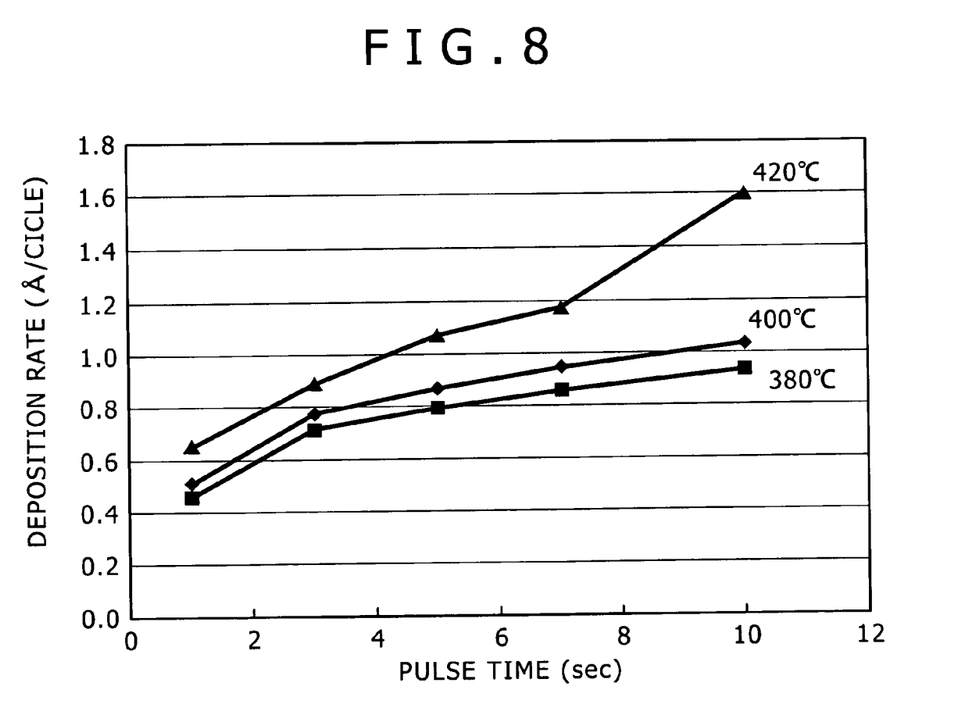
FIG. 8 is a graphical representation showing a behavior of a film deposition rate for an amount of precursor supplied per one cycle when a wafer temperature during an atomic layer deposition (ALD) process is changed.

On the other hand, in order to obtain the satisfactory step coverage in the deep trench (DT) shape, it becomes important to supply the sufficient amount of precursor and also to suppress the vapor phase reaction of the precursor. As has been described above, when the substrate temperature during the ALD processing is made too high, the precursor is thermally decomposed to impede the adsorption reaction for the uppermost surface. Thus, it is understood from FIG. 7 as well that the uppermost limit of the substrate temperature exists when the satisfactory step coverage characteristics are obtained. However, this is made clear from a relationship as well between a deposition rate and a cycle time (pulse time) shown in FIG. 8. FIG. 8 is a graphical representation showing a behavior of a film deposition rate for an amount of precursor supplied per one cycle when a wafer temperature during an atomic layer deposition process is changed.

As shown in FIG. 8, it is understood that when the substrate temperature is set at 380° C. or 400° C., the hafnium silicate film is deposited at a given deposition rate. This state is one in which the pure ALD reaction is occurring. Thus, even when the amount of precursor supplied per one cycle is increased, the film deposition rate shows a tendency to be saturated at a given value. On the other hand, when the substrate temperature was set at 420° C., it was confirmed that when the amount of precursor supplied was increased, the film deposition rate increased. This means that a component generated by the thermal decomposition of the precursor is contained in the hafnium silicate film thus deposited. That is to say, the reason for this is that the film deposition reaction proceeds from the atomic layer deposition reaction to the chemical vapor deposition growth (CVD) reaction. When such a state is caused, it becomes difficult to obtain the excellent coverage characteristics since the thermal deposition of the precursor occurs to impede the adsorption reaction of the precursor for the uppermost surface. For example, it was verified that when the hafnium silicate film was deposited for the deep trench (DT) having the aspect ratio of about 50, no hafnium silicate film was deposited at all on the bottom portion of the trench in the process at 420° C., whereas the hafnium silicate ($HfSiO_x$) film was deposited even on the bottom portion of the trench in the process at 400° C. or less. It is understood from this respect as well that the substrate temperature is preferably set at 400° C. or less. In addition, even when the substrate temperature is set at 400° C., the CVD reaction occurs if the pressure of the film deposition ambient atmosphere exceeds 667 Pa. From this respect as well, as has been described above, the pressure of the film deposition ambient atmosphere is preferably equal to or higher than 267 Pa (=0.27 kPa) and equal to or lower than 667 Pa (=0.67 kPa). Also, the pressure of the film deposition ambient atmosphere is more preferably equal to or higher than 267 Pa and equal to or lower than 533 Pa (=0.53 kPa).

Consequently, when the hafnium silicate film is deposited for such a structure having a large aspect ratio and a large surface area as in the deep trench (DT) shape, it is necessary to set the substrate temperature during the ALD process at 400° C. or less. Considering objectively and collectively the restriction to the leakage current, it is necessary to set the substrate temperature during the ALD process in the range of 330° C. to 400° C.

In addition, with regard to the amount of precursor supplied, in the case of tetrakis methylethyl amino hafnium: $Hf[N(CH_3)(C_2H_5)]_4$, its vapor pressure must be set at 4.0 Pa or more, and its flow rate must be set at 0.1 cm$^3$/min or more. Also, in the case of tetrakis methylethyl amino hafnium: $Si[N(CH_3)(C_2H_5)]_4$, its vapor pressure must be set at 3.10 Pa or more, and its flow rate must be set at 4.1 cm$^3$/min or more. In this embodiment, a bubbler is used in a system for supplying the raw materials, and argon (Ar) is used as the carrier gas. In this case, this supply amount corresponds to the case where a bubbler temperature of tetrakis methylethyl amino hafnium: $Hf[N(CH_3)(C_2H_5)]_4$ is set at 70° C., and a flow rate of Ar is set at 50 cm$^3$/min, and a bubbler temperature of tetrakis methylethyl amino silicon: $Si[N(CH_3)(C_2H_5)]_4$ is set at 60° C., and a flow rate of Ar is set at 50 cm$^3$/min.

In the above description, the case where the hafnium composition ratio is 50% has been shown as an example. For example, when the hafnium composition ratio is increased, the lines each indicating the step coverage in FIGS. 7 and 8 shift to the lower temperature and lower pressure direction, and the lines each indicating the leakage current in FIGS. 7 and 8 shift to the lower leakage current. On the other hand, when the hafnium composition ratio is decreased, the lines each indicating the step coverage in FIGS. 7 and 8 shift to the direction along which the substrate temperature, and the pressure of the film deposition ambient temperature increase, the lines each indicating the leakage current in FIGS. 7 and 8 shift to the direction along which the leakage current increases. However, when the hafnium composition ratio is in the range of about 30% to about 70%, the substrate temperature during the ALD process is preferably in the range of 330° C. to 400° C., and the pressure of the film deposition ambient atmosphere is preferably equal to or higher than 267 Pa and equal to or lower than 667 Pa. Also, the pressure of the film deposition ambient atmosphere is more preferably equal to or higher than 267 Pa and equal to or lower than 533 Pa.

As has been described so far, according to the embodiment of the method of manufacturing a semiconductor device of the present invention, when the capacitor insulating film is deposited in the form of the hafnium silicate ($HfSiO_x$) film, the hafnium silicate film is deposited by utilizing the atomic layer deposition method using the hafnium raw material, the silicon raw material and the oxidizing agent. As a result, it is possible to reduce the concentration of the impurities such as carbon (C) contained in the hafnium silicate film. In addition, the hafnium silicate film can be deposited so as to obtain the excellent step coverage during formation of the trench capacitor by adjusting the substrate temperature and the film deposition pressure for the hafnium silicate film. In such a manner, reduction in concentration of the impurities such as carbon (C) makes it possible to make the generation level of the leakage current equal to or lower than the allowable level for the capacitor insulating film. That is to say, the reduction in concentration of the impurities contained in the hafnium silicate film, and the improvement in the coverage characteristics for such a three-dimensional structure as in the trench shape can be made compatible with each other. As a result, even in the so-called deep trench (DT) capacitor having the aspect ratio of e.g., about 50, it is possible to fulfill the capacitor capacity of 30 fF/cell or more and the leakage current of 1 fF/cell or less which are necessary for the stable DRAM operation. In addition, it is also possible to replace the existing material for the insulating film of the deep trench (DT) capacitor with the hafnium silicate, HfSiON, having a higher dielectric constant, which leads to the further scale down.

At that, in addition to the above-mentioned materials, any of materials such as tetramethoxy hafnium: $Hf(OCH_3)_4$, tetraethoxy hafnium: $Hf(OC_2H_5)_4$, tetra-i-propoxy hafnium: $Hf(O-i-C_2H_7)_4$, tetra-n-butoxy hafnium: $Hf(O-n-C_4H_9)_4$, tetrakis diethyl amino hafnium: $Hf[N(C_2H_5)_2]_4$, and tetra-1-methoxy-2-propoxy hafnium: $Hf[OC(CH_3)_2-CH_2OCH_3]_4$ can also be used as an example of the hafnium raw material in the above-mentioned ALD method.

Also, in addition to the above-mentioned materials, any of materials such as dimethyl dimethoxy silane: $Si(CH_3)_2(OCH_3)_2$, dimethyl diethoxy silane: $Si(CH_3)_2(OC_2H_5)_2$, methyl trimethoxy silane: $SiCH_3(OCH_3)_3$, methyl triethoxy silane: $SiCH_3(OC_2H_5)_3$, tetramethyl silane: $Si(CH_3)_4$, hexamethyl disilane: $[Si(CH_3)_3]_2O$, and hexamethyl disilazane: $(CH_3)_3SiNHSi(CH_3)_3$ can also be used as an example of the silicon raw material in the above-mentioned ALD method.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a semiconductor device having a trench capacitor comprising:
    forming a trench in a substrate body;
        forming a first electrode on an inner surface of the trench;
        forming a capacitor insulating film on a surface of said first electrode; and
        forming a second electrode on a surface of said capacitor insulating film, said method comprising:
    depositing said capacitor insulating film in a form of a hafnium silicate film by utilizing an atomic layer deposition method using a hafnium raw material, a silicon raw material and an oxidizing agent, wherein a temperature of the substrate body while said hafnium silicate film is deposited in the atomic layer deposition process is set equal to or higher than 330° C. and equal to or lower than 400° C.

2. The method of manufacturing a semiconductor device according to claim 1, wherein in the atomic layer deposition method of depositing said hafnium silicate film,
    any of materials expressed by chemical formulas of $Hf[N(CH_3)(C_2H_5)]_4$, $HfCl_4$, $Hf(C_5H_7O_2)_4$, $Hf[N(C_2H_5)_2]_4$, $Hf[N(CH_3)_2]_4$ and $Hf[O(t-C_4H_9)_2]_4$ is used as said hafnium raw material, and
    any of materials expressed by chemical formulas of $SiCl_4$, $Si_2Cl_6$, $Si[N(CH_3)_2]_4$, $[(CH_3)_2SiH]_2O$, $SiH[N(CH_3)_2]_3$, and $Si[N(CH_3)(C_2H_5)]_4$ is used as said silicon raw material, and
    any of materials expressed by chemical formulas of $O_3$, $H_2O$ and $D_2O$ is used as said oxidizing agent.

3. The method of manufacturing a semiconductor device according to claim 1, wherein a pressure of a film deposition ambient atmosphere in the atomic layer deposition process is set equal to or higher than 267 Pa and equal to or lower than 667 Pa.

4. The method of manufacturing a semiconductor device according to claim 1, wherein a pressure of a film deposition ambient atmosphere in the atomic layer deposition process is set equal to or higher than 267 Pa and equal to or lower than 533 Pa.

5. A method of manufacturing a semiconductor device having a trench capacitor comprising:
    forming a trench semiconductor device portion;
        forming a first electrode over an inner surface of the trench;
        forming a capacitor insulating film over a surface of said first electrode; and
        forming a second electrode over a surface of said capacitor insulating film,
    said method further comprising:
    depositing said capacitor insulating film in a form of a hafnium silicate film by utilizing an atomic layer deposition method using a hafnium raw material, a silicon raw material and an oxidizing agent, and wherein a pressure of a film deposition ambient atmosphere in the atomic layer deposition process is set equal to or higher than 267 Pa and equal to or lower than 667 Pa. and further wherein a temperature of the substrate body within which the trench is formed while said hafnium silicate film is deposited in the atomic layer deposition process is set equal to or higher than 330° C. and equal to or lower than 400° C.

6. The method of manufacturing a semiconductor device according to claim 5, wherein a pressure of a film deposition ambient atmosphere in the atomic layer deposition process is set equal to or higher than 267 Pa and equal to or lower than 533 Pa.

* * * * *